United States Patent
Pezeshki

(10) Patent No.: US 9,425,917 B1
(45) Date of Patent: Aug. 23, 2016

(54) HIGH DATA RATE LONG REACH TRANSCEIVER USING WAVELENGTH MULTIPLEXED ARCHITECTURE

(75) Inventor: Bardia Pezeshki, Redwood City, CA (US)

(73) Assignee: NeoPhotonics Corporation, San Jose, CA (US)

( * ) Notice: Subject to any disclaimer, the term of this patent is extended or adjusted under 35 U.S.C. 154(b) by 273 days.

(21) Appl. No.: 11/686,931

(22) Filed: Mar. 15, 2007

Related U.S. Application Data

(60) Provisional application No. 60/782,432, filed on Mar. 15, 2006.

(51) Int. Cl.
*H04J 14/02* (2006.01)

(52) U.S. Cl.
CPC ..................................... *H04J 14/02* (2013.01)

(58) Field of Classification Search
CPC .............................. H01S 5/026; H04B 10/506
USPC .................................................. 398/164, 201
See application file for complete search history.

(56) References Cited

U.S. PATENT DOCUMENTS

| | | | | |
|---|---|---|---|---|
| 4,813,051 | A * | 3/1989 | Taneya et al. | 372/50.12 |
| 4,815,088 | A * | 3/1989 | Matsumoto et al. | 372/50.12 |
| 5,946,331 | A | 8/1999 | Amersfoort et al. | |
| 6,301,031 | B2 * | 10/2001 | Li | 398/9 |
| 6,910,780 | B2 | 6/2005 | Vail et al. | |
| 7,006,719 | B2 * | 2/2006 | Joyner et al. | 385/14 |
| 7,010,185 | B2 | 3/2006 | Grubb et al. | |
| 7,050,719 | B2 | 5/2006 | Lemoff et al. | |
| 7,060,517 | B2 | 6/2006 | Joyner et al. | |
| 7,079,715 | B2 * | 7/2006 | Kish et al. | 385/14 |
| 7,092,598 | B2 | 8/2006 | Evans | |
| 7,130,124 | B2 * | 10/2006 | Ketterson et al. | 359/569 |
| 7,158,699 | B2 | 1/2007 | Welch et al. | |
| 7,190,904 | B2 * | 3/2007 | DeCusatis et al. | 398/95 |
| 7,200,296 | B2 | 4/2007 | Kish, Jr. et al. | |
| 7,242,699 | B2 * | 7/2007 | Arimoto | 372/20 |
| 7,283,694 | B2 | 10/2007 | Welch et al. | |
| 7,292,608 | B1 * | 11/2007 | Nowell et al. | 370/506 |

(Continued)

FOREIGN PATENT DOCUMENTS

WO   WO 2005/053124 A1 *   6/2005   ............... H01S 5/12

OTHER PUBLICATIONS

T. Ohyama et al., "Compact 8-Wavelength×2.5 Gbit/s Transmitter/Receiver Module Using PLC Hybrid Integration Technology for WDM Interconnections", Electronics Letters, Nov. 2002.*

K. Kudo, "1.55-m Wavelength-Selectable Microarray DFB-LD's with Monolithically Integrated MMI Combiner, SOA, and EA-Modulator", IEEE Photonics Technology Letter, vol. 12, No. 3, Mar. 2000.*

(Continued)

*Primary Examiner* — Shi K Li

(74) *Attorney, Agent, or Firm* — Dardi & Herbert, PLLC; Peter S. Dardi

(57) ABSTRACT

Optical telecommunication modules including transmitters and receivers and methods of using same. In some embodiments the transmitters include a chip having an array of lasers and a combiner for combining light from the lasers for transmission over an optical fiber. Preferably the lasers have widely spaced wavelengths. The chip may be semi-cooled in some embodiments. A dither signal may be provided to one laser for use by a receiver in tracking temperature of the laser for improved receiver performance. In some embodiments a plurality of EMLs are used instead of a greater number of plurality of DFBs for transmission.

5 Claims, 6 Drawing Sheets

(56) References Cited

U.S. PATENT DOCUMENTS

| | | | |
|---|---|---|---|
| 7,340,122 B2 | 3/2008 | Welch et al. | |
| 7,424,041 B2 * | 9/2008 | Meliga et al. | 372/20 |
| 7,570,671 B2 * | 8/2009 | Perkins et al. | 370/535 |
| 7,835,415 B2 * | 11/2010 | Behfar et al. | 372/64 |
| 2002/0105718 A1 * | 8/2002 | Bacher et al. | 359/334 |
| 2005/0275920 A1 * | 12/2005 | Sumi | B82Y 20/00 359/241 |
| 2007/0104242 A1 * | 5/2007 | Kudo et al. | 372/96 |
| 2007/0166039 A1 * | 7/2007 | Spagnoletti et al. | 398/85 |

OTHER PUBLICATIONS

"Introduction to DWDM Technology" by S. Kartalopoulos, SPIE Press, 2000, pp. 116-117.*

*High Performance Polarization-Independent WDM Filtering Using an InP Reflective Arrayed Waveguide Grating.* By Soole, J.B.D.; Amersfoort, M.R.; LeBlanc, H.P.; Rajhel, A.; Caneau, C.; Youtsey, C.; Adesida, I. This paper appears in: Lasers and Electro-Optics Society Annual Meeting, 1996. LEOS 96., IEEE pp. 228-229, vol. 2, Nov. 18-21, 1996 vol. 2.

* cited by examiner

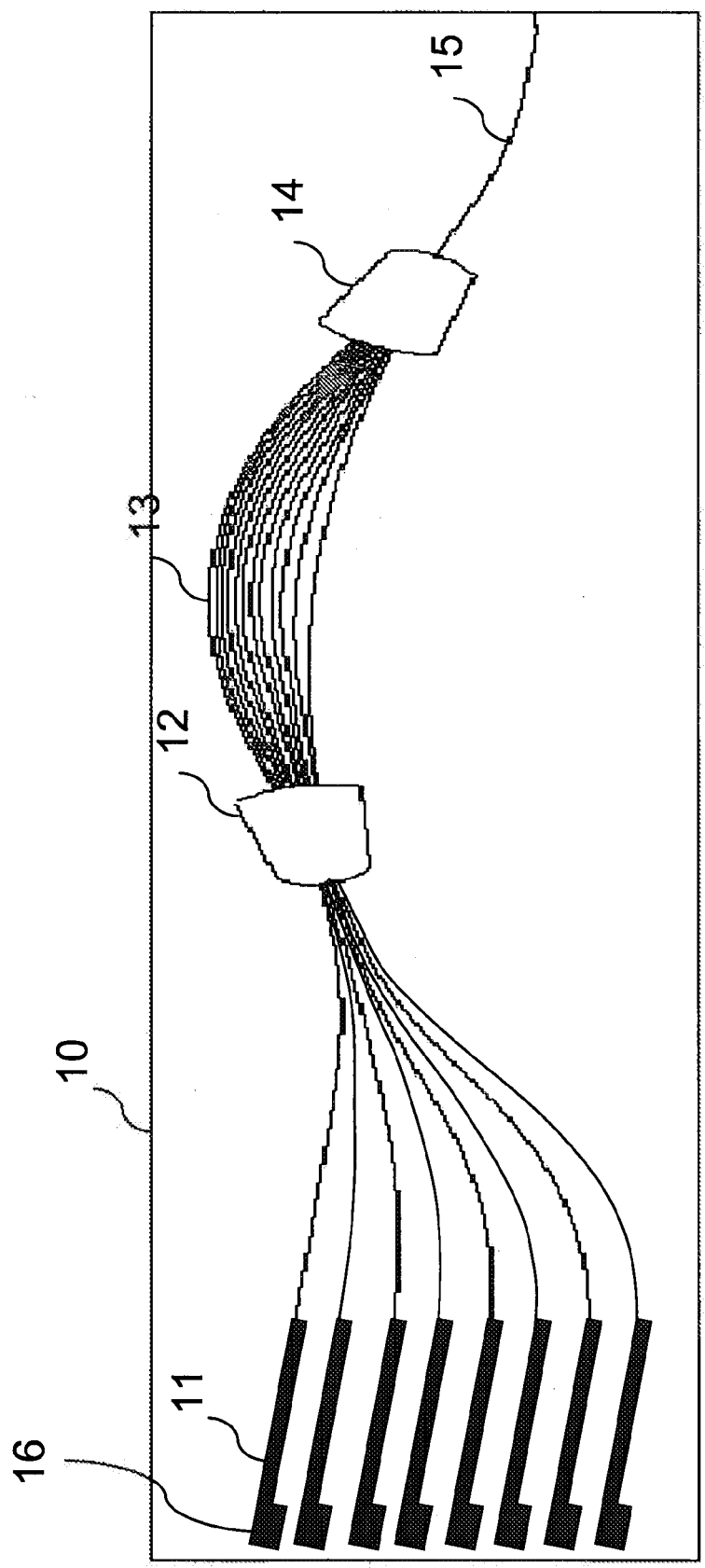

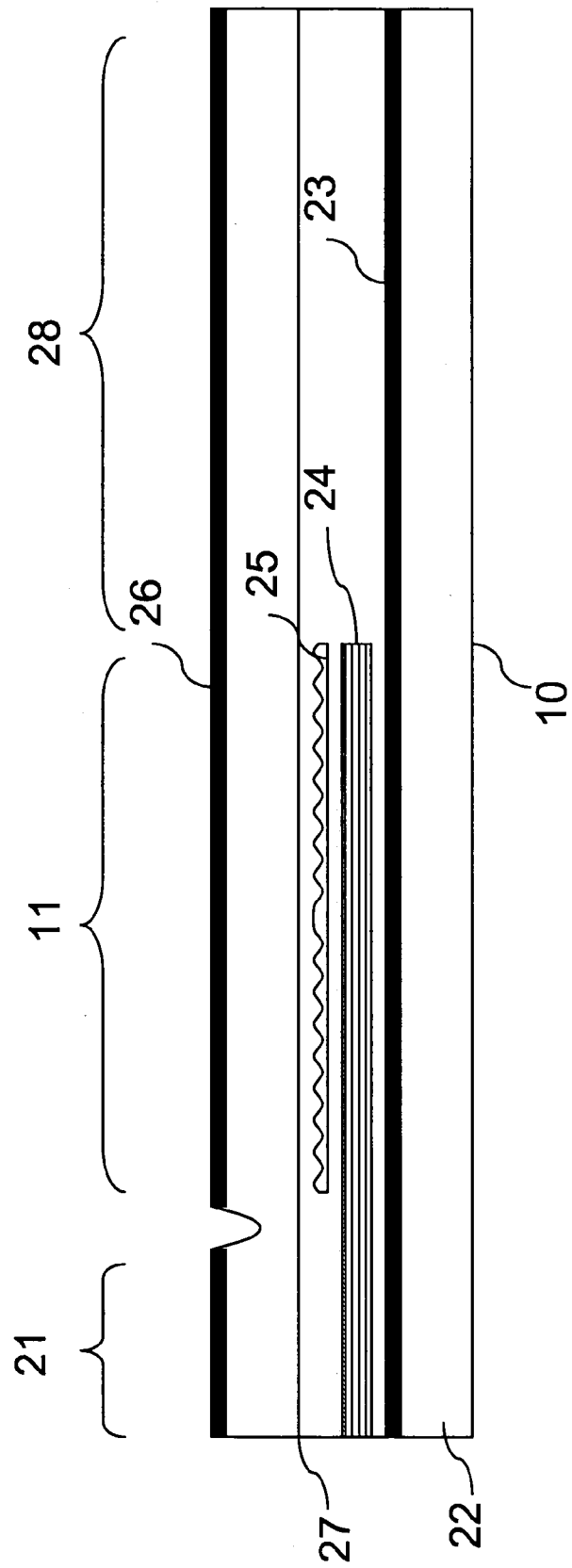

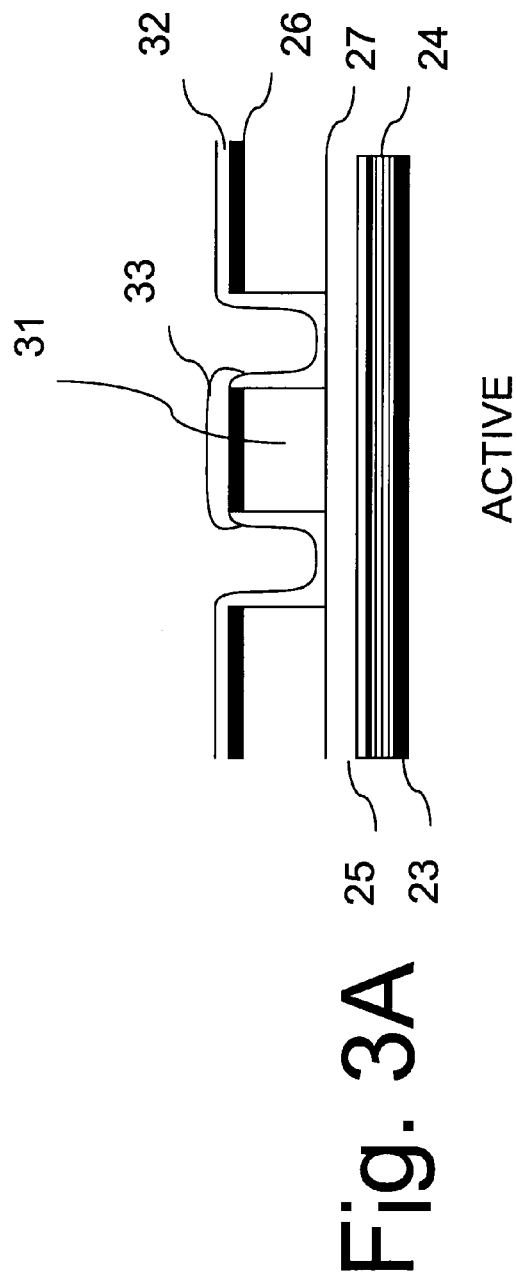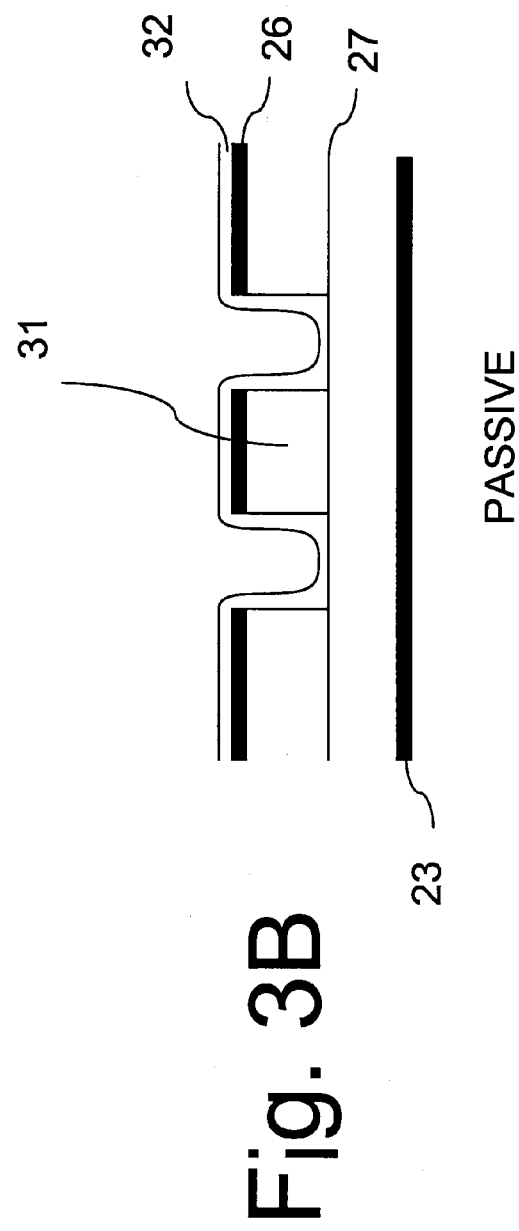

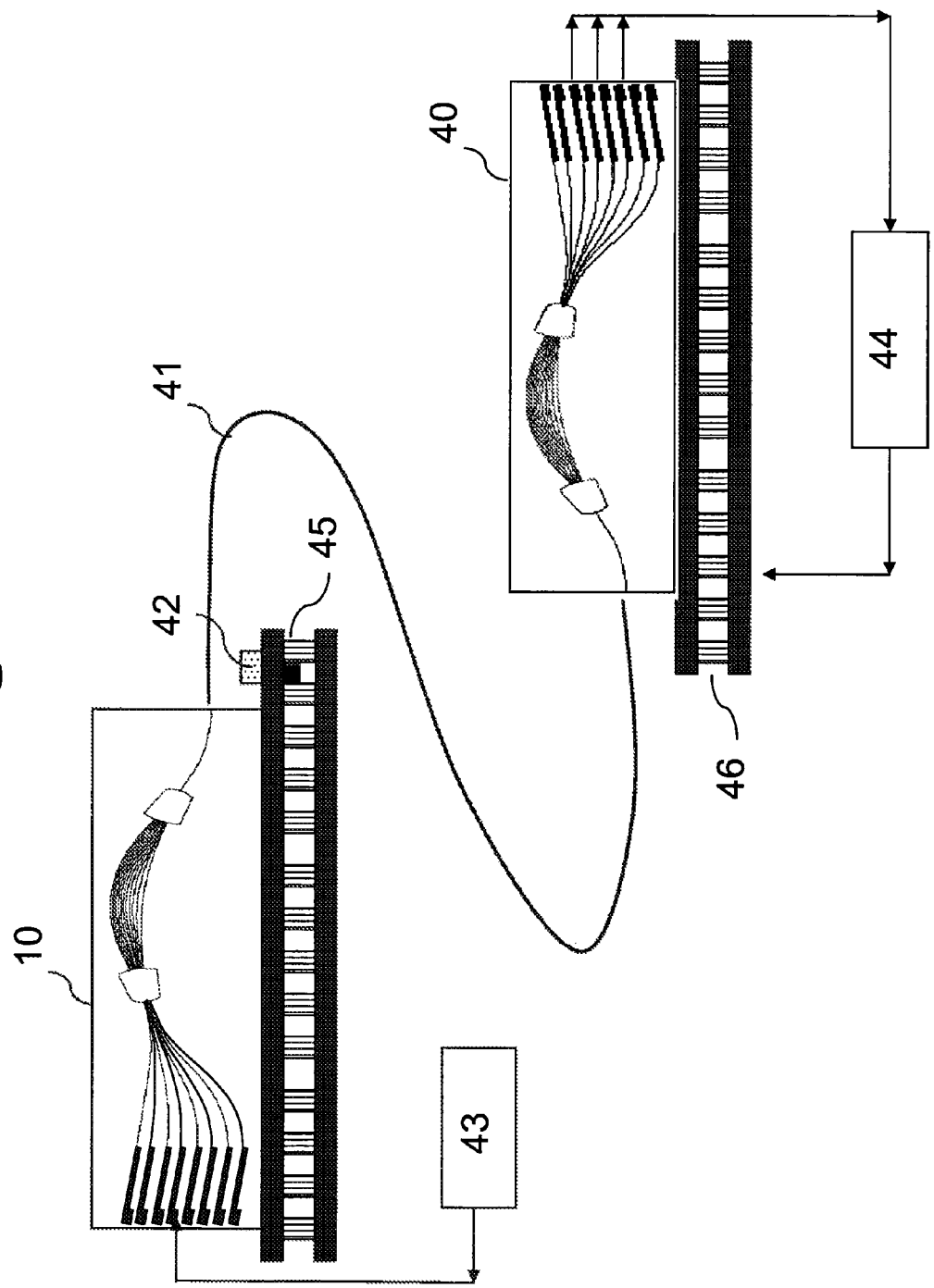

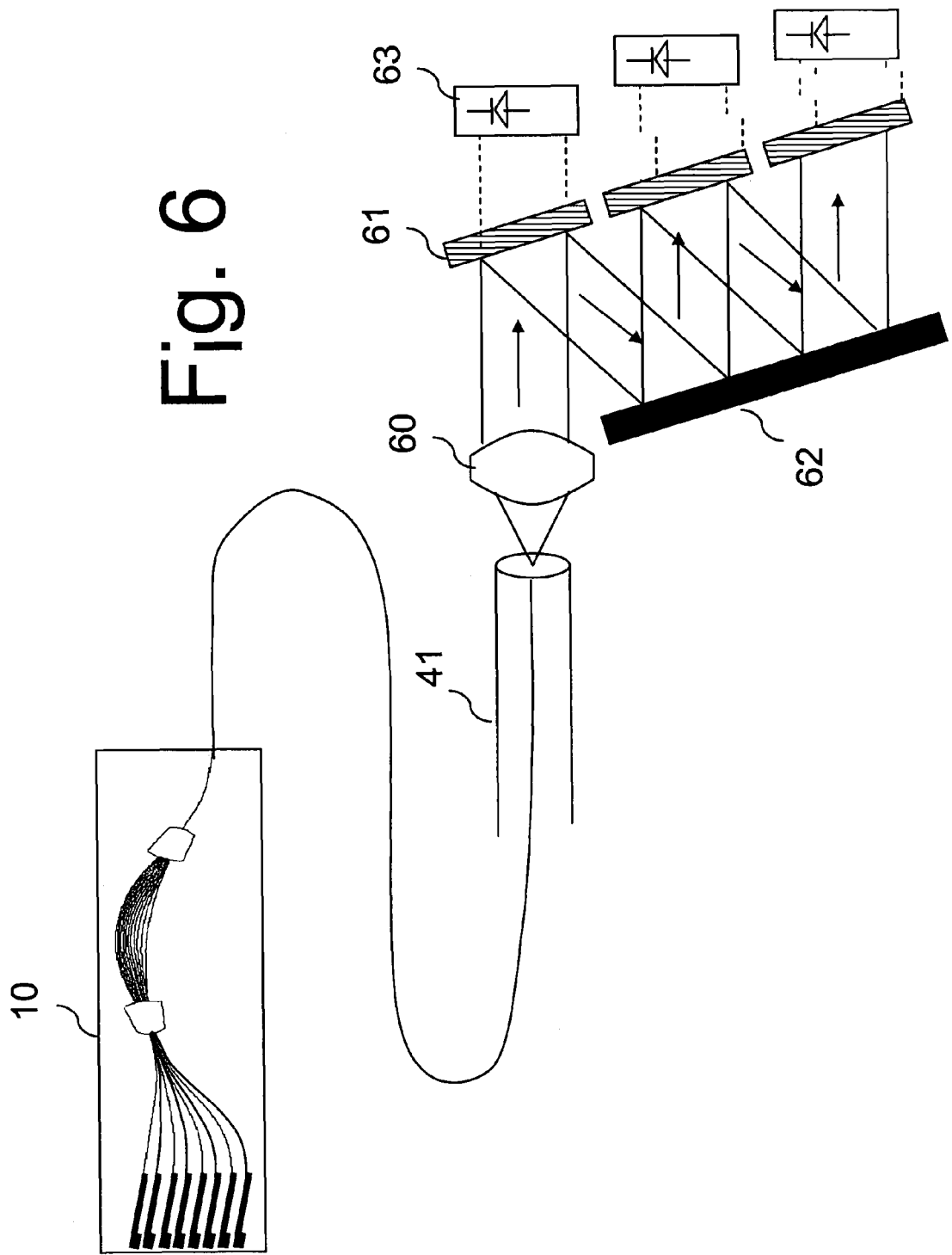

HIGH DATA RATE LONG REACH TRANSCEIVER USING WAVELENGTH MULTIPLEXED ARCHITECTURE

CROSS-REFERENCE TO RELATED APPLICATION

This application claims the benefit of U.S. Provisional Patent Application No. 60/782,432, filed Mar. 15, 2006, the disclosure of which is incorporated herein by reference.

BACKGROUND OF INVENTION

This invention relates generally to optical communications, and more particularly to optical telecommunication modules providing multiple modulated signals simultaneously from a single integrated device and receivers thereof.

Telecommunication systems can be broadly divided into two separate domains. In the line-side, or long haul side, data are transferred long distances between local hubs, with optical amplification compensating for loss and dispersion compensating modules maintaining signal integrity. On the client side, or datacom side, on the other hand, the distances are generally short such that optical amplification and dispersion compensation is not needed.

Given the challenging requirements for transmitting signals thousands of miles, the components on the line side tends to be very high performance and quite costly, such as custom linecards or 300 pin transponders employing tunable lasers in the 1550 nm wavelength band and lithium niobate modulators for encoding data. Typically many closely spaced channels are multiplexed onto the same fiber (DWDM-dense wavelength division multiplexing). The channels are closely spaced at 25 GHz (0.2 nm), 50 GHz (0.4 nm) or 100 GHz (0.8 nm), and complicated optical filters are used to multiplex and demultiplex sometimes hundreds of these closely-spaced signals. The major advantage of DWDM in these systems is that optical amplifiers can boost the closely spaced channels simultaneously, eliminating the need for optical to electrical and back to optical conversion (OEO). OEO conversion may require demultiplexing hundreds of channels, receiving, reclocking, and regenerating in the electrical domain and then re-multiplexing them would be inordinately complicated and expensive A very different school of thought has recently emerged that rather than using optical amplifiers together with dispersion compensation modules, attempts to make a very low cost OEO using integration. The idea is that low cost integration can eliminate the need for optical amplifiers and dispersion compensation by making OEO cost effective at every repeater. The system tries to use standard wavelength spacing and fully meet telecom's exacting standards. However, the integration compromises performance compared to discrete components, limiting chirp performance or degrading signal quality.

The client side, or the datacom side, is very different. In this case spans are generally short (40 Km or 80 Km maximum), and optical amplifiers are rare. Usually no dispersion compensation is used, and the reach is limited for example by the chirp of the signal and the dispersion of the fiber for solutions at 1550 nm wavelength, and limited by fiber loss for solutions at 1310 nm wavelength, with possibly the best performance obtained at 1550 nm. The components on the client side are usually lower cost, as exemplified by "pluggable" transceivers, with single channels passing through a fiber. Generally the lasers are uncooled for cost and power consumption reasons, and the resulting drifts in wavelength prohibit accurate wavelength multiplexing.

As bandwidth requirements increase, with different applications such as Internet games and IPTV (Internet protocol television) requiring large amounts of data, the bandwidth needs are increasing at all levels. In the long haul side, additional DWDM channels are possibly added as needed. Since this is a scalable procedure, costs do not rise dramatically. On the client or datacom side that is not multi-wavelength, generally the only way to increase capacity is to increase speed. However, this becomes increasingly impossible at higher speeds as one hits fundamental physical or engineering issues and simply increasing the speed of each link is not always a viable option. For example, CMOS drivers that work well at 2.5 Gb/s may produce insufficient current drive at 10 Gb/s. Similarly, lasers cannot be modulated at frequencies much past their internal relaxation oscillation resonance peak. The reach also drops as bandwidth increases, being roughly inversely proportional to the square of the bandwidth. A directly modulated laser, for example that can have a 150 Km reach at 2.5 Gb/s, may only go 10 Km at 10 Gb/s, the reach generally going inversely as the bandwidth squared. The use of electro-absorption modulators, or even lithium niobate modulators for reduced chirp only increases cost, complexity, and power consumption. Thus there is a need to increase the aggregate data rate for datacom applications without simply increasing the serial speed of the communications The IEEE 802.3-2005 standard (which now incorporates the amendment 802.3ae-2002), incorporated by reference herein, relates to an architecture generally called the LX4 architecture. The LX4 architecture attempts to address the need for longer reach and higher speed transmission in the datacom arena by adding parallelism. The main problem the standard attempts to solve is that high bandwidth communication is limited in a multi-mode fiber, as modal dispersion limits the reach. Though 2.5 Gb/s signals can travel 300 m in multimode fiber, 10 Gb/s cannot. Therefore the standard calls for four separate channels to be multiplexed together at lower speeds to achieve a 10 Gb/s aggregate rate. Products on the market implement this standard with four separate lasers, each in an individual package and a bulk optic or fiber multiplexer at the transmitter side, and a demultiplexer and four separate photodetectors on the receiver side. Unfortunately, this results in increased component count, and therefore increased cost. Moreover, the effective transmission range of a system employing an LX4 architecture may be less than desired for many datacom applications. An integrated module that combines all these functionalities in a single chip would obviously reduce the cost of such a system.

In summary, integration of high performance components to reduce cost or eliminate optical amplifiers in the exacting world of telecom is challenging as integration compromises performance. However, the looser datacom world can allow for the compromises of integration if the manufacturing cost drops dramatically. This patent addresses the need for low cost integrated parallel components for datacom communications.

SUMMARY OF THE INVENTION

In an aspect of an embodiment the invention provides an architecture using an array of directly modulated lasers integrated with a wavelength-selective combiner on a compound semiconductor substrate. The wavelengths of the laser array may be spaced far apart to allow uncooled or semi-cooled operation. The wide wavelength spacing makes for a simple integrated multiplexer that uses a small amount of chip real-estate. This results in a simple low cost chip that generates multiple modulated signals simultaneously. A receiver side, with some embodiments including both a transmitter and a receiver, some embodiments including only a transmitter, and some embodiments including only a receiver, can also employ a similar demultiplexer with an array of pin photodiodes that is either uncooled, or semi-cooled to track the transmitter. The lower drive speed of the lasers allows the use of low cost silicon driver chips, yet the array can have an aggregate bandwidth that is enormous. For example, an array of 8 lasers running at 5 Gb/s will deliver 40 Gb/s of bandwidth with a reach of 40 Km, all with simple and low cost electronics. In contrast a single directly modulated laser is almost impossible at 40 Gb/s, and if it were so, the reach would be less than 1 Km and would require very expensive compound semiconductor drive electronics.

The lasers in some embodiments of this invention are short DFB lasers with an intra-cavity phase shift for modal stability. The short cavity results in low thresholds and high differential efficiency. The modulation current and voltage can be kept low such that silicon drivers are possible even at 10 Gb/s operation. The short cavity length allows quantum well material with high differential gain for low chirp and high relaxation oscillation frequency. The extinction ratio is kept low (3-5 dB) for good chirp characteristics, even when detuning of the gain from the laser peak is not optimal.

The wavelength selective multiplexer is ideally an arrayed waveguide grating (AWG), though Eschelle gratings or other structures are used in some embodiments. The resolution of such a device is a simple function of the device size, and large channel spacing between the lasers keeps this device compact. The output of the AWG is fiber coupled to a single mode fiber either with or without an optical isolator in between.

In one aspect the invention provides a photonic transmitter integrated circuit, comprising an array of lasers on a substrate, each laser in the array of lasers emitting light at different wavelengths, with a wavelength spacing greater than 1.6 nm; and an interferometric combiner positioned on the substrate to receive light emitted by lasers of the array of lasers, interferometric combiner configured to combine light emitted by the array of laser.

In another aspect the invention provides a method of communicating data over an optical fiber using a transmitter and a receiver, the transmitter including a chip with an array of distributed feedback lasers, with a wavelength spacing for light emitted by the lasers of at least 1.6 nm, and an interferometric combiner for combining light emitted from the lasers, the method comprising modulating each of the lasers with a data signal; applying a further signal to a selected at least one of the lasers; detecting the further signal at the receiver, and adjusting the temperature of the receiver to maximize the detected further signal.

BRIEF DESCRIPTION OF THE DRAWINGS

FIG. 1 is a schematic of the transmitter photonic integrated circuit;

FIG. 2 is a cross section of the transmitter integrated circuit along the length of the device;

FIG. 3 is a cross section of the transmitter integrated circuit perpendicular to the length of the device, with 3A along the active and 3B along the passive sections;

FIG. 4 shows a communication link where the transmitter is partially cooled, and the receiver tracks the temperature drifts of the transmitter;

FIG. 6 shows a communication link composed of a photonic integrated circuit transmitter and a conventional bulk optic demultiplexer and diode array, with preferably the passband of the bulk optic demultiplexer wide enough to accept wavelength changes of the transmitter IC with temperature variations.

DETAILED DESCRIPTION

Figure 5:
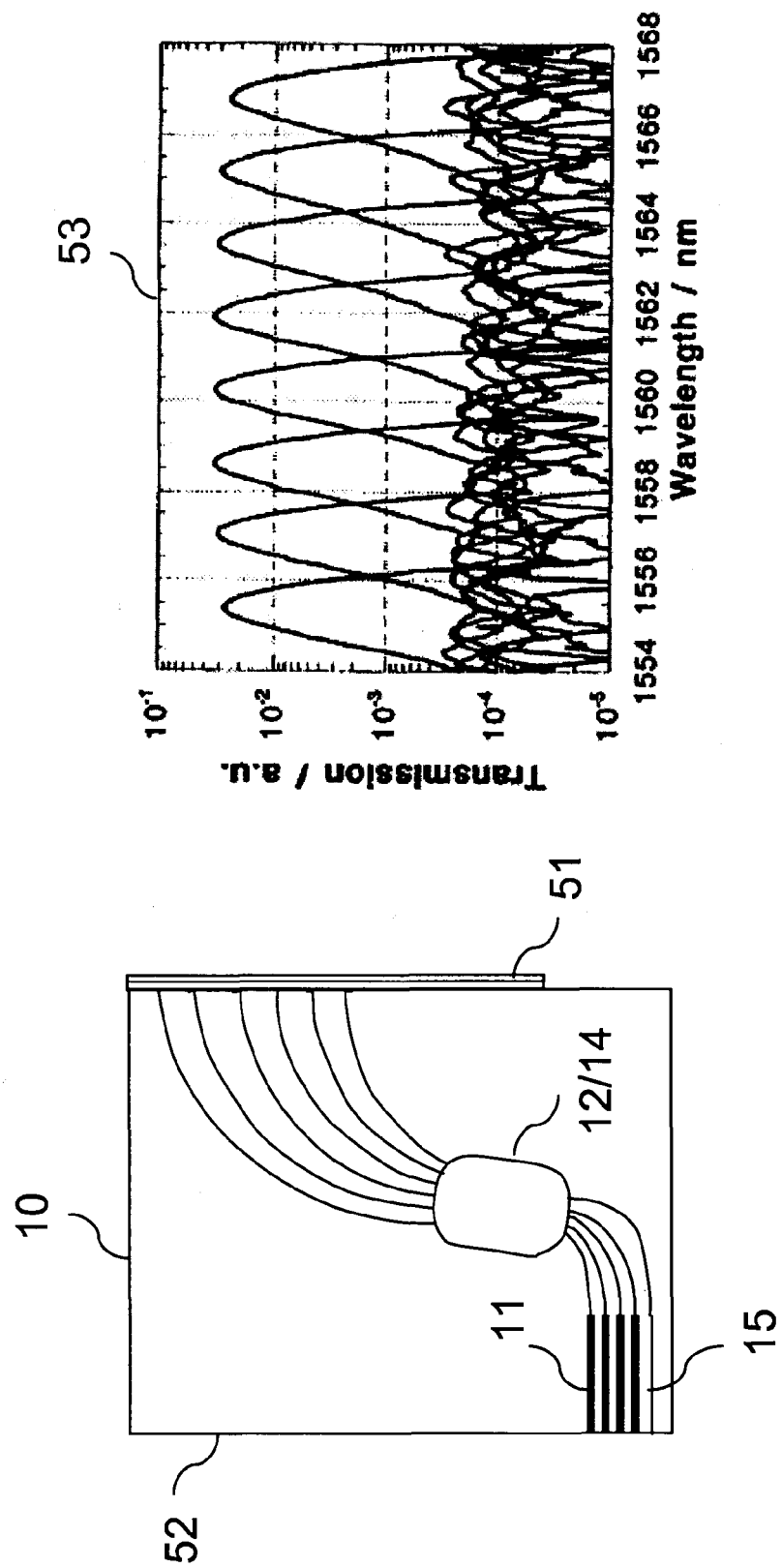
FIG. 5 is a reflective transmitter photonic integrated circuit for smaller size and the multiplexer characteristics.

Reference is made to FIG. 1 illustrating an embodiment of a transmitter integrated circuit 10. A chip is made in InP semiconducting material and has 8 phase shifted DFB lasers 11. Each laser has a different grating pitch such that the wavelengths of the lasers are separated, preferably by 5 nm. The output of these lasers enters passive waveguides that contain no active region. These passive waveguide connect to an arrayed waveguide grating (AWG) (combination of 12, 13, 14) that multiplexes all the wavelengths of light together into a single output 15. The entire chip 10 can be made quite compact, since the wavelength spacing between the laser elements is large. In fact, the resolution of the AWG is dependent on the length difference between the arms, the wider laser wavelength spacing means a smaller AWG is possible.

The lasers are preferably directly modulated devices. In such embodiments each laser has a bond pad 16, that is connected to a driver source. Directly modulating the lasers encodes the signal on the laser. The physical spacing between the lasers preferably is large enough to prevent any substantial thermal or electrical cross talk. The laser array is preferentially built on a p-type substrate, such that the laser array acts as a common anode device. This allows for faster drive electronics, as npn bipolar transistors or NMOS transistors are faster and smaller than their p-type counter parts. Alternatively, the lasers are made on a semi-insulating substrate, and both the n and p contacts are made available to allow a common anode or common cathode configuration, or differential driving configuration. The laser cavities are quite short (typically 250 microns or shorter) with a strong grating (high κL). The short laser enhances the modulation frequency, reduces the threshold current and also increases the differential efficiency to keep the overall power consumption low. The phase shift position is preferably offset to the front to increase front facet output power. Both the rear and the front facet of the IC are preferably anti-reflection coated to maintain stable DFB lasing mode determined by the phase shift.

The active and passive regions can be made, for example, either with ridge or buried heterostructure (BH) waveguide topology. The advantage of the BH structure is the lasers will have lower thresholds and potentially higher slope efficiency, reducing the overall power consumption of the integrated circuit. Ridge waveguides, on the other hand, can have a high index contrast laterally between the core and the cladding, especially when etched deeply. This makes for tighter waveguide bends that leads to a smaller device. The preferred embodiment described shows a ridge laser configuration for simplicity.

FIG. 2 shows a cross section of a device such as embodiment of the device 10. One single DFB laser 11 is shown. The structure is grown on a p-type InP substrate 22 and contains a buried waveguide 23 that underlies the entire structure. This buried waveguide is made of a transparent quaternary alloy such as InGaAsP with a photoluminescence wavelength of typically 1.15 um. The thickness is typically 1500 A, to give a waveguide mode compatible with both active and passive sections of the device. The layer is doped p-type to be electrically conducting. In the laser, there are quantum wells providing the active gain which are intrinsically undoped. The quantum wells are also quaternary material, but with a gain peak at about 1550 nm. Above the quantum wells is a grating layer 25 in transparent quaternary material, etched to select a particular lasing wavelength, and containing a phase shift to provide modal stability. All the layers above the quantum wells, including the grating are doped n-type. Above the grating is an n-type InP spacer, an etch stop layer 27 and more n-InP cladding and finally an InGaAs contact layer 26. The chip is made of three sections. The DFB structure 11 has quantum wells and grating layer, while the passive sections 28, used for the AWG and the waveguide bends has only the waveguiding layer. The other section 21 not shown in the first figure, is an optional integrated photodiode, electrically isolated from the DFB by etching the InGaAs contact layer 26 and optionally some of the InP. This section is reverse biased to absorb the light exiting the rear of the DFB and acts as a monitor photodiode. The photocurrent from this section can be used to keep the optical power of the laser constant with time and temperature.

As an example of fabrication of such a device, first the buried waveguide layer 23 and the quantum wells 24 and the grating layer 25 are grown on a p-type substrate using low pressure metal-organic chemical vapor deposition. The wafer is then masked and a phase-shifted grating fabricated in the grating layer 25 with electron beam lithography and wet etching. The wafer is then regrown with a thin InP layer in a second MOCVD step. Two photolithography steps follow where the grating layer is removed in the integrated photodiode section and both the grating layer and the active layers are removed in the passive sections. The top p-cladding is then grown in the final MOCVD step across both the active and passive regions.

FIGS. 3A and 3B show cross sections of a chip perpendicular to the lasers and to the waveguides. FIG. 3A shows the cross section through the active portion, while FIG. 3B shows the cross section through the passive portion. As an example of fabrication of such a structure once the growths are complete, the device is processed by etching ridge waveguides down to the etch-stop layer. The ridge waveguide itself 31 laterally supports the main optical mode. The width of the ridge would typically be about 2 microns wide, with the etch stop about 300 nm above the active region. After etching the ridge, a dielectric such as SiN 32 is applied over the entire wafer using plasma enhanced chemical vapor deposition, and is then etched at the top of the ridge on the active sections, where metallization 33 is applied. The passive sections (FIG. 3B) contain no grating layer, and no quantum wells. Leaving the InGaAs contact layer (26) intact in the passive sections should have no disadvantage if the n-type cladding layer is sufficiently thick to preclude optical absorption in the InGaAs. The integrated circuit is cleaved to form front and rear facets and anti-reflection coated to maintain modal stability There are many variations on this active-passive integration that are well known in the art. For example, in some embodiments the grating can be placed below the quantum wells rather than on top. The substrate can be n-type or semi-insulating rather than p-type and the dopings are reversed or the lower region contacted from the top through an etched region. The grating layer can run continuously through the device, but only patterned in the laser section. Similarly, the quantum wells can be present in all sections, but be shifted in bandgap by alloy disordering in the passive sections. As previously mentioned, a buried heterostructure geometry can be used to increase efficiency of the lasers. With ridge waveguides, one may etch the passive regions deeper to increase the waveguide confinement and allow for tighter bending radius. This decreases the size of the AWG.

Preferably the wavelength spacing between the laser array is sufficiently wide to allow a compact multiplexer and also allow uncooled or semi-cooled operation. Cost and low power consumption are often integral to the use of this technology in the datacom or client-side applications. For longer reach, 1550 nm operation is preferred due to lower optical fiber loss. The preferred embodiment would use 8 lasers with 5 nm spacing to give an overall span from end to the next of 45 nm. This much bandwidth can be supported by a single active region composition for all the lasers, and all the wavelengths would fit in the low loss section of optical fiber. With 5 nm spacing, there is not quite enough margin for the lasers to run completely uncooled in the traditional manner. The wavelength of a DFB at this range changes approximately 0.1 nm per degree C. Thus −5 C to 85 C operation would cause the wavelength of the lasers to vary by 9 nm, exceeding the spacing. There are multiple options to solving this problem, with the second option discussed below perhaps being the preferred embodiment.

In some embodiments the laser array is run semi-cooled. For example, a thermoelectric cooler (TEC) may be placed under the laser array and either heats or cools the laser to reduce the overall temperature range. Thus when the ambient temperature changes from −5 C to 85 C, the chip temperature would only vary from 25 C to 65 C. This limits the power consumption of the TEC.

In some embodiments the receiver has a TEC, in addition to the laser array having a TEC in some embodiments, and tracks the shifts of the laser array. This is realized in some embodiments by placing a dither on a predetermined channel, and the receiver adjusting the receiver temperature to optimize the dithered signal from this channel. This allows narrower channel spacing on the laser array. For example, in this embodiment, the laser array may be run completely uncooled, and the wavelength will drift approximately 8 nm over the typical −5 C to 75 C temperature range. The receiver will track this change using a TEC. This lowers the overall power consumption of the module compared to a cooled system because cooling a laser array that generates heat consumes substantially more power than cooling a detector array that generates very little heat. In a related technique, substantial improvements in power consumption would be obtained by heating the receiver chip rather than cooling it. In this way the receiver would track the transmitter. The heating can be obtained either with thin film heaters placed on the IC itself, or with a bulk heater underneath the chip. Other modes of tracking include tunable filters that are well known in the art.

In some embodiments the wavelength spacing between the lasers is set such that the change in wavelength due to temperature is less than the wavelength spacing of the array. For example, CWDM standards use a 10 nm or 20 nm spacing. In this case multiple active regions could be used for the array, as a single active region composition generally cannot provide enough gain for all channels. Etching and regrowing a second active region increases the complexity of the fabrication, but the increased wavelength spacing would allow a smaller AWG multiplexer. In some embodiments temperature control in the receiver is used to allow the receiver to track the wavelengths of the transmitter if a semiconductor AWG is used at the receiver. A bulk optic demultiplexer using thin film filters at the receiver would have a flat passband and not require any temperature control.

In some embodiments, and potentially the simplest solution, the laser transmitter is run at a fixed temperature with the TEC. Ideally, this temperature is relatively high (e.g. 55 C) to minimize power consumption. Nevertheless, the power consumption may become prohibitive for the smallest pluggable applications (e.g. XFP-like transceivers)

FIG. 4 shows a schematic of a semicooled transmitter and receiver pair, showing a combination of a TEC semi-cooled laser array and a TEC temperature controlled receiver, with a dither signal placed on a predetermined channel through application of a dither current to a selected laser of the laser array. A transmitter IC 10 is mounted on a thermoelectric cooler 45 along with a thermistor 42. Should the thermistor sense (or electronics or processor receiving thermistor information determine) that the temperature has increased above 65 C, for example, electrical current is applied to the thermoelectric cooler to reduce the temperature of the transmitter IC. Similarly, if the thermistor senses too low a temperature, below 25 C, for example, current is supplied in the opposite direction to the thermoelectric cooler to heat the applies IC. Thus the temperature of the IC is always maintained between 25 C and 65 C. A dither current from control electronics 43 is sent to a known element of the array, such as laser number 4. The output of the transmitter IC is coupled to an optical fiber 41 (lenses, and optional isolator not shown). The other side of the fiber is coupled to a receiver IC 40 that has a similar AWG and a pin diode array in place of a laser array. The received signal is analyzed by the receiver control electronics 44 and the dither signal is detected. The temperature of the receiver IC is maintained by another TEC 46. The control electronics adjusts the temperature to maximize the dither signal at photodetector element 4, thus maintaining registration between the laser array and the receiver array.

There are of course numerous variations on this principle. As previously mentioned, the transmitter IC can be left completely uncooled, and the receiver can track the temperature of the transmitter as described. Alternatively, both the transmitter and receiver can be temperature stabilized to a calibrated value to maintain registration. A more conventional bulk optic receiver can be used based on fused silica that is insensitive to temperature and channels are broad enough to accept variations in the wavelength of the transmitter. This is shown schematically in FIG. 6. In this case the transmitter photonic integrated circuit 10 is a combination of laser arrays and an AWG, as previously described. However, the receiver utilizes thin film filters, mirrors and separate photodetectors. The optical beam form the fiber is collimated with a lens 60. The collimated optical beam reflects from various thin film filters 61, each filter passing a single wavelength band to a photodetector 63. An additional broadband mirror 62 returns the beam to the filters on each subsequent reflection. Such bulk optical demultiplexers are known in the art and can have broad, temperature insensitive characteristics. Alternatively, an AWG with broadened pass-band characteristics can be used, either in InP or in another material such as silica-on-silicon.

There are also many variations on the arrayed waveguide gratings that can be used in this invention. Since size is often a crucial component of cost, methods of decreasing the size of this multiplexing and demultiplexing component is essential. One method of doing so, is to use a reflective grating, as shown in FIG. 5. In this case output of the laser array 11 goes into the star coupler 12, which then fans out onto a multiplicity of waveguides. However, half way across this array the chip is cleaved and coated with a high reflectivity material, such as SiO2/Si multilayers 51. The light reflects back onto the arrayed waveguides and the star coupler 12 acts in reverse as to lead to the output waveguide 15. The other side of the chip is anti-reflection coated 52. Very preferably the AWG is designed such that the laser elements do not reflect back on themselves at any wavelength with gain, otherwise the laser is likely to oscillate in unwanted modes. The reflective design can be used both for multiplexing DFB sources as well as demuxing at the receiver. A plot 53 shows the performance of a filter with this design and 1.6 nm spacing. The insertion loss was 5 dB, the cross-talk <−20 dB and the channel spacing 1.6 nm. Even with this narrow a spacing, the chip size was 2.4 mm by 1.2 mm (J.B.D. Soole, Lasers and Electro-Optics Society meeting (LEOS) 1996, paper WCC2, incorporated by reference herein).

In such a widely spaced WDM architecture, skew of the different signals can be important. For example with 5 nm spacing between 10 lasers, there is a 45 nm total spread. The propagation delay between the two extreme wavelengths after a 40 Km link in dispersive fiber (20 ps/nm-km) is 360 bits at 10 Gb/s. The electronics in the module preferably stores the data and compensates for the skew. An embodiment of the invention would use a four element laser array running at about 10 Gb/s to obtain an aggregate of 40 Gb/s and a electronic buffer to compensate for the skew at the receiver. The module would be housed in a form factor compatible with standard OC768 transmission, and that the laser uses 4 wavelengths to obtain the desired bandwidth would be transparent to the user. The cost of such a module using four separate directly lasers would be tremendously lower than using high end 40 Gb/s serial components. Furthermore, the reach would improve from about 2 Km for serial 40 Gb/s using expensive LiNbO modulators to better than 10 Km using much lower cost directly modulated DFBs.

Longer reach and higher signal speeds can be obtained by using arrays of EMLs (lasers with electro-absorption modulators) rather than DFBs. At 1550 nm the standard reach of a DFB is 10-20 Km, while that of an optimized EML is 80 Km. In the 1310 nm band, EMLs have exhibited sufficient uncooled performance at 25 Gb/s. Thus 100 Gb/s transmission can be obtained by using an array of four EMLs running at 25 Gb/s, rather than 10 DFB lasers running at 10 Gb/s. In addition, the aggregate bandwidth is frequently set higher than the requirement to allow for error correction, thus one may use a four element array each at 27 GHz to get 100 Gb/s transmission or ten DFBs running at 12 Gb/s to get the same result.

In some embodiments some or all of predistortion, electronic dispersion compensation, and most likely sequence estimates are used with the components or systems discussed herein. The continuing improvement in electronics make directly modulated lasers more appealing, as techniques such as predistortion, electronic dispersion compensation (EDC) and most likely sequence estimators (MLSE) can increase the reach of chirped signals in predictable dispersive media. The array architecture described here allows the use of slower modulation in lasers which makes these techniques much easier to implement. Adding EDC to the receiver of such a module, for example, can substantially extend the reach of the link. Similarly, applying predistortion at the transmitter, and/or MLSE at the receiver, can also affectively extend the reach of the link.

An embodiment of the invention comprises a photonic transmitter integrated circuit that combines directly modulated lasers with an interferometric combiner wherein the lasers are distributed feedback elements (DFBs), the wavelength spacing is greater than 1.6 nm between lasers, the entire chip is not operated at constant temperature, but allowed to drift somewhat with varying case temperature to conserve electrical power.

In some embodiments the invention comprises a communication link and/or method of using a communication link between a transmitter as described above, and a receiver comprising a similar integrated photonic circuit that uses an array of photodetectors and an interferometric demultiplexer, where the temperature of the demultiplexer is adjusted to track the wavelengths of the transmitter.

In some embodiments the invention comprises a communication link and/or method of using same as described above, where a dither is placed on at least one of the lasers, allowing the receiver to identify the wavelength channels.

In some embodiments the transmitter as discussed above includes an interferometric combiner which may be an arrayed waveguide grating.

In some embodiments the invention comprises a communication link between a transmitter as described above and a receiver, wherein thin film optical filters are used in the receiver to selectively demultiplex the wavelengths with a large enough wavelength range to accommodate changes in the transmitter wavelength with temperature.

The invention may be as described herein, including the associated drawings, and should be considered to encompass the valid claims supported by this disclosure and insubstantial variations thereof.

What is claimed is:

1. A photonic transmitter integrated circuit, comprising:
    a semiconductor chip with front and rear facets with associated anti-reflection properties; a substrate;
    an array of distributed feedback (DFB) lasers formed on the substrate, each laser in the array of lasers having a grating with a phase shift position offset to the front to increase front facet power, its own bond pad for receiving a data signal, a laser cavity length no greater than 250 microns and emitting light at different wavelengths, with a wavelength spacing between adjacent laser wavelengths greater than 5 nm; and
    an arrayed waveguide grating formed on the substrate to receive light emitted by lasers of the array of lasers, the arrayed waveguide grating configured to combine light emitted by the array of lasers; and
    a temperature controller designed to maintain the array of lasers in a semi-cooled state such that the wavelength range of the lasers in the array does not exceed the wavelength spacing but allowed to drift over a temperature range that would exceed a wavelength spacing less than 1.6 nm.

2. The photonic transmitter integrated circuit of claim 1, further comprising an integrated photo diode on the substrate on a side of the DFB lasers opposite the interferometric combiner.

3. The photonic transmitter integrated circuit of claim 2 wherein the integrated photo diode is electronically isolated from the DFB lasers.

4. The photonic transmitter integrated circuit of claim 3 wherein the integrated photo diode is reverse biased.

5. The photonic transmitter integrated circuit of claim 1 wherein the temperature controller is configured to adjust the temperature if the temperature of the circuit migrates outside of a temperature window of about 40 C.

* * * * *